(12) United States Patent
Weisfield et al.

(10) Patent No.: US 6,348,693 B1
(45) Date of Patent: Feb. 19, 2002

(54) X-RAY IMAGER AND ITS METHOD OF FABRICATION

(75) Inventors: Richard L. Weisfield, Los Altos; Rene Lujan, Sunnyvale; Charles T. Malone, Palo Alto, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/397,067

(22) Filed: Sep. 16, 1999

(51) Int. Cl.7 .............................................. H01L 31/055
(52) U.S. Cl. ................. 250/370.11; 250/370.1
(58) Field of Search ................ 250/370.11, 370.01, 250/370.08, 370.09, 372, 374, 338.4; 257/59; 438/69

(56) References Cited

U.S. PATENT DOCUMENTS

| | | | |
|---|---|---|---|
| 5,233,181 A | | 8/1993 | Kwansnick et al. |
| 5,435,608 A | * | 7/1995 | Wei et al. .................. 257/59 |
| 5,585,280 A | * | 12/1996 | Kwasnick et al. ............. 437/4 |
| 5,703,355 A | | 12/1997 | Kawamoto |
| 6,121,622 A | * | 9/2000 | Beyne et al. ................ 250/374 |

* cited by examiner

Primary Examiner—Constantine Hannaher
Assistant Examiner—Otilia Gabor
(74) Attorney, Agent, or Firm—Finnegan, Henderson, Farabow, Garrett & Dunner, LLP

(57) ABSTRACT

An x-ray imager and method of fabricating an x-ray imager that provides protection to the sensor arrays and the barrier layer from the corrosive effects of the scintillating material. The x-ray imager includes a benzo-cyclo-butene layer between the barrier layer and the scintillating material. The benzo-cyclo-butene layer provides several advantages including low cost and application by spin coating or spray coating.

15 Claims, 3 Drawing Sheets

X-RAY IMAGER AND ITS METHOD OF FABRICATION

FIELD OF THE INVENTION

The present invention relates generally to the design and fabrication of an x-ray imager, and more particularly to the design and fabrication of an x-ray imager in which the sensor arrays are protected from the corrosive effects of the scintillating material.

BACKGROUND OF THE INVENTION

A conventional x-ray imager (10), as shown in FIG. 1, typically includes a barrier layer (30) between a photosensor array (20) and a scintillating material (40).

The scintillating material (40), such as cesium iodide doped with thallium, emits optical photons in response to absorption of incident x-ray radiation. Cesium iodide, in particular, is ideally suited as a scintillating material because, when deposited, forms needle-like columns (42) that provide light piping. The columns are typically several microns in diameter and several hundred microns long.

A conventional sensor array (20) is also shown in FIG. 1. The sensor array absorbs the optical photons emitted by the scintillating material and generates electrons in proportion to the energy flux of the photons. Photodiodes collect the charge which are periodically measured and then reset to a known charge in order to process electrical signals generated by the photodiode in response to the incident radiation.

The sensor array (20) is formed of a plurality of photosensitive elements arranged in rows and columns on a substrate (11). A conventional photosensitive element is shown in FIG. 2. Each photosensitive element (21) comprises a photodiode comprising a photosensitive island (24) of amorphous silicon (a-Si) over a bottom contact pad (26) and with an upper conductive layer (28) of indium tin oxide over the assembly. A passivation layer (50) is disposed under the upper conductive layer (28) except where the upper conductive layer (28) is in electrical contact with the upper surface of the of the photosensor island (24). The photosensitive element further includes a n-type doped region (23) and a p-type doped region (25). A conventional passivation layer (50) comprises a silicon nitride layer (27) and a polyimide layer (29).

The barrier layer (30) is typically silicon nitride, silicon oxide, or silicon oxynitride. It serves several purposes including protecting the sensor array from the scintillating material, providing a surface to which the scintillating material can adhere, providing optical coupling between the scintillating material and the sensor array, and protecting the sensor array from moisture. Performance of the sensor array can also be degraded by a number of factors including exposure to the solvents used in fabrication and exposure to the high temperatures used to anneal the scintillating material.

Kwasnick et al. (U.S. Pat. No. 5,401,668) disclose a two layer barrier layer to protect the sensor array from moisture and improve adhesion of the scintillating material. As shown in FIG. 1, Kwasnick et al. disclose a silicon oxide layer (32) deposited to a thickness of 0.5 to 1.5 microns over the sensor array and a silicon nitride layer (31) deposited to a thickness of 0.05 to 0.15 microns over the silicon oxide layer. This method, however, uses a plasma enhanced chemical vapor deposition process for fabrication of both layers that requires the sensor array to be put back into the deposition chamber. Furthermore, depending on the material selected for the barrier layer, the corrosive effects of scintillating material may damage the barrier layer as well as the underlying sensor array. Silicon oxynitride is an ideal barrier layer because it provides good optical coupling between the scintillating material and the underlying sensor array. Cesium iodide, however, chemically attacks silicon oxynitride causing metal corrosion in the underlying arrays resulting in severe leakage current and failure of the x-ray detector.

In light of the foregoing, there is a need for a method to protect the barrier layer and the sensor array of an x-ray detector from the corrosive effects of cesium iodide.

SUMMARY OF THE INVENTION

Accordingly, the present invention is directed to an x-ray imager including an a-Si sensor array incorporating photodiodes, a barrier layer formed over the sensor array, a benzo-cyclo-butene layer formed over the barrier layer, and an x-ray scintillating material formed over the benzo-cyclo-butene coating.

In another aspect, the invention is directed to a method of making an x-ray imager having an a-Si sensor array protected from the corrosive effects of an x-ray scintillating material including the steps of depositing a barrier layer over the a-Si sensor array, depositing a benzo-cyclo-butene layer over the barrier layer, curing the benzo-cyclo-butene layer in an oxygen free atmosphere, depositing an x-ray scintillating material over the benzo-cyclo-butene layer, and annealing at a temperature up to about 300° C.

In another aspect, the invention is directed to a sensor array having a corrosion resistant coating, comprising photosensitive elements, a barrier layer formed over the sensor array, and a benzo-cyclo-butene layer formed over the barrier layer, wherein the benzo-cyclo-butene layer provides corrosion resistance to the sensor array and the barrier layer from a subsequently applied scintillating material.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
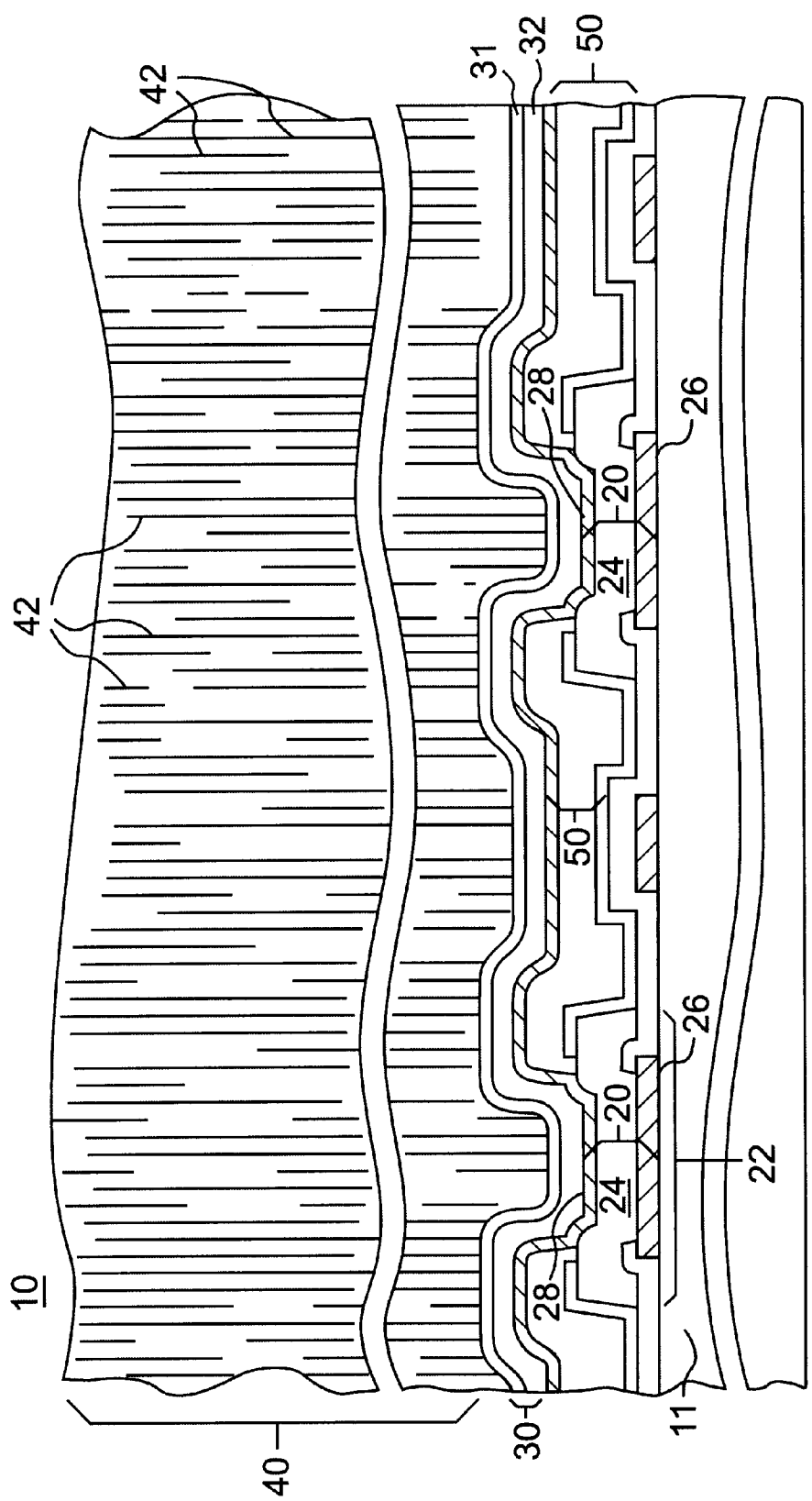
FIG. 1 is a cross-sectional view that illustrates a prior art x-ray imager.
Figure 2:
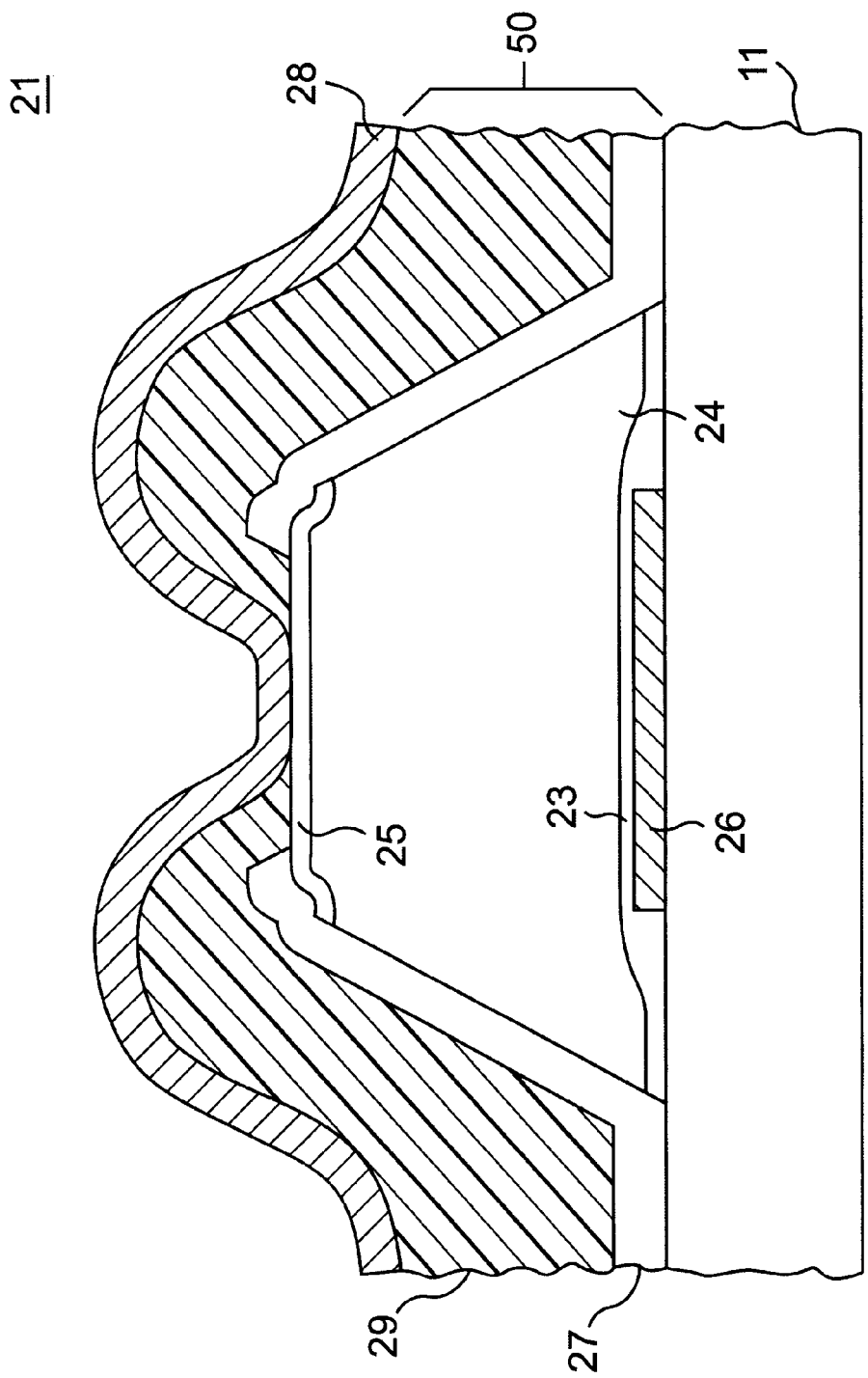
FIG. 2 cross-sectional view that illustrates a prior art photosensitive element.
Figure 3:
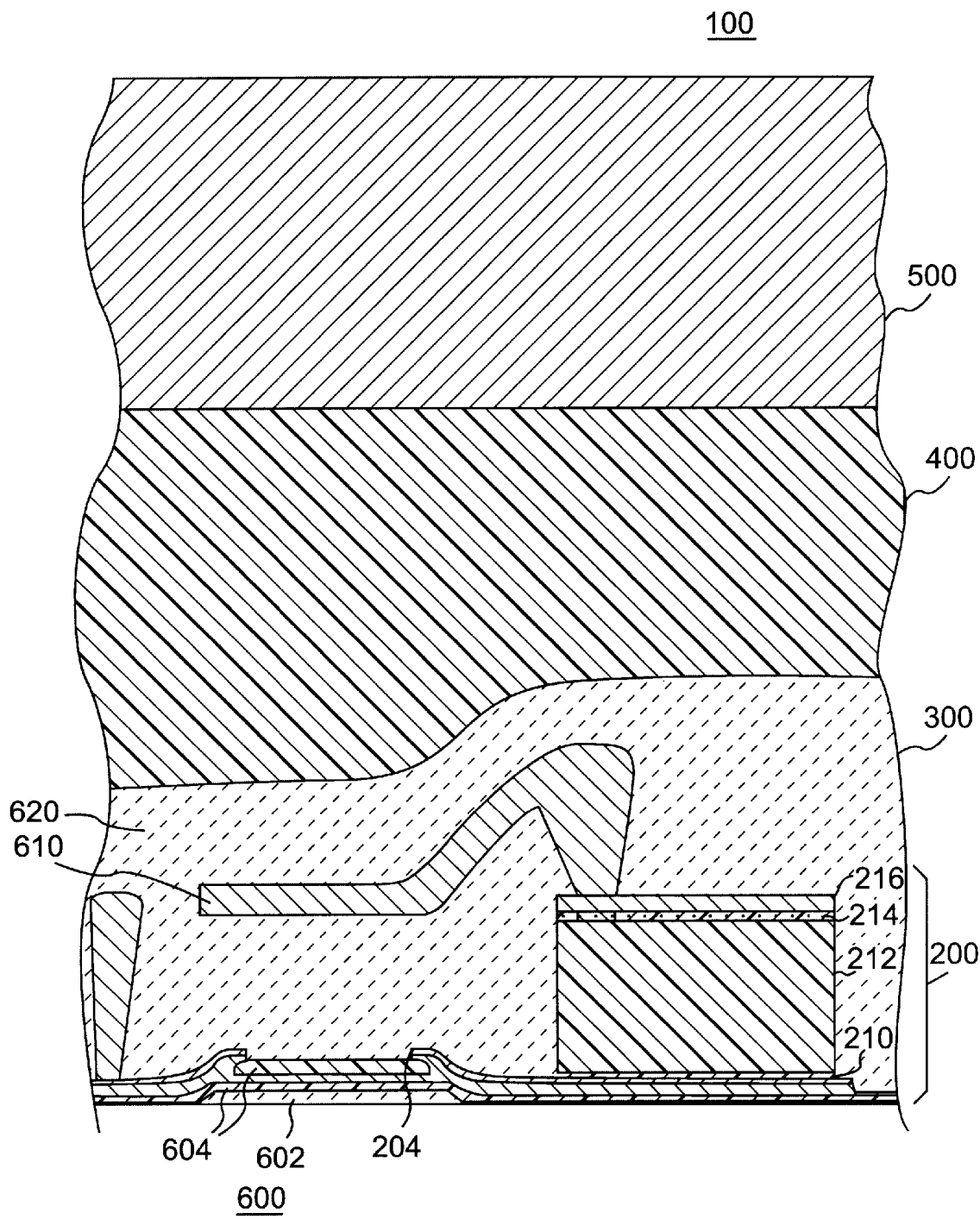
FIG. 3 is a cross-sectional view that illustrates an x-ray imager according to one embodiment of the present invention.

FIG. 3 illustrates the components of the x-ray imager formed in accordance with the principles of the present invention. According to one aspect of the invention, the fundamental components of an x-ray imager (100) comprise an a-Si sensor array (200), a barrier layer (300) deposited over the sensor array, a benzo-cyclo-butene layer (400) formed over the barrier layer, and an x-ray scintillating material (500) deposited over the benzo-cyclo-butene layer. The x-ray imager according to one embodiment of this invention also includes thin film transistors (600) (TFT) comprising a gate (602), source and drain region (204), silicon nitride layers (604), and data lines and bias lines (not shown). The TFT serves as an isolated switch providing an output signal from the photosensor element to the imager. The x-ray imager according to one aspect of the invention also includes top metal (610) and a light shield (620).

A sensor array according to one embodiment of the present invention is shown in FIG. 3. The sensor array (200) comprises an N+ doped region (210), and i a-Si layer (212), a P+ doped layer (214) and an contact layer of, for example, indium tin oxide (ITO) (216). The continuous amorphous silicon photodiode layer maximizes light absorption and provides high x-ray conversion efficiency.

The barrier layer (300) comprises, for example, a silicon oxynitride layer with a thickness between about 0.5 to 3 microns and preferably with a thickness of about 1.5 microns. A silicon oxynitride layer is typically deposited in a plasma enhanced chemical vapor deposition (PECVD) process using a gaseous mixture of silane, ammonia, and nitrous oxide. The deposition temperature is between about 250 to 300° C. and the frequency is about 13.7 MHz. The use of silicon oxynitride allows a balance of the compressive stress of an oxide layer with the tensile stress of a nitride layer to form a low stress layer that resists cracking when covering thick topography such as the photodiodes in the sensor array.

The benzo-cyclo-butene layer (BCB)(400) is then deposited over the silicon oxynitride barrier layer. BCB is polymer manufactured by the Dow Chemical Company that provides several benefits as a coating in an x-ray imager. First, it is optically transparent, so it does not interfere with the photons generated by the scintillating material. Second, it protects the underlying silicon oxynitride layer and sensor array from the corrosive effects of the scintillating material. Third, it can be applied in a low cost technique after processing of the sensor arrays without reintroduction into the plasma deposition chamber. And once cured, BCB remains stable up to about 350° C. to 400° C.

The BCB layer is preferably applied by spin coating or spray coating. Other techniques, however, such as any method for applying a photoresist layer may be used. The BCB should be deposited to a thickness greater than the topography of surface of the sensor array and less than the size of a pixel. This correlates to a thickness of about 1.5 to 10 $\mu$m. Preferably, the thickness of the BCB layer should be between about 3 to 5 $\mu$m.

The BCB layer is then cured in an oxygen free atmosphere at a temperature between about 230° C. to 250° C. This can be done, for example, by curing in a vacuum oven or an oven purged with an inert gas.

The scintillating material is, for example, cesium iodide doped with thallium. Cesium iodide doped with thallium can be deposited by evaporation over the BCB to form a structure with needle-like columns. These columns are typically several microns in diameter and several hundred microns long. After deposition, the scintillating material is heat treated at a temperature of about 250° C. to 300° C. for about one hour in an inert atmosphere or vacuum to increase its x-ray conversion efficiency.

It will be apparent to those skilled in the art that various modifications and variations can be made in the x-ray imager and in the process of manufacturing the present invention without departing from the spirit or scope of the invention. Thus, it is intended that the present invention cover the modifications and variations of this invention provided they come within the scope of the appended claims and their equivalents.

What is claimed is:

1. An x-ray imager comprising:
    an a-Si sensor array incorporating photodiodes;
    a barrier layer formed over the sensor array;
    a benzo-cyclo-butene layer formed over the barrier layer;
    and an x-ray scintillating material formed over the benzo-cyclo-butene coating.

2. The x-ray imager of claim 1, wherein the x-ray scintillating material comprises cesium iodide doped with thallium.

3. The x-ray imager of claim 1, wherein the barrier layer comprises silicon oxynitride.

4. The x-ray imager of claim 1, wherein the benzo-cyclo-butene layer is between about 1.5 to 10 microns thick.

5. The x-ray imager of claim 1, wherein the benzo-cyclo-butene layer is between about 3–5 microns thick.

6. A method for fabricating an x-ray imager having an a-Si sensor array protected from the corrosive effects of an x-ray scintillating material comprising the steps of:
    depositing a barrier layer over the a-Si sensor array;
    depositing a benzo-cyclo-butene layer over the barrier layer;
    curing the benzo-cyclo-butene layer in an oxygen free atmosphere;
    depositing an x-ray scintillating material over the benzo-cyclo-butene layer;
    annealing at a temperature up to about 300° C.

7. The method of claim 6, wherein the benzo-cyclo-butene layer is between about 3 to 5 microns thick.

8. The method of claim 6, wherein the step of depositing the benzo-cyclo-butene layer comprises spin coating.

9. The method of claim 6, wherein the step of depositing the benzo-cyclo-butene layer comprises spray coating.

10. The method of claim 6, wherein the x-ray scintillating material comprises cesium iodide doped with thallium.

11. The method of claim 6, wherein the barrier layer comprises silicon oxynitride.

12. A sensor array with a corrosion resistant coating comprising:
    a plurality of a-Si photosensitive elements incorporating photodiodes;
    a barrier layer formed over the sensor array;
    a benzo-cyclo-butene layer formed over the barrier layer, wherein the benzo-cyclo-butene layer provides corrosion resistance to the sensor array and a passivation layer from a subsequently applied scintillating material.

13. The sensor array of claim 12, wherein the barrier layer comprises silicon oxynitride.

14. The sensor array of claim 12, wherein the benzo-cyclo-butene layer is between about 1.5 to 10 microns thick.

15. The sensor array of claim 12, wherein the benzo-cyclo-butene layer is between about 3 to 5 microns thick.

* * * * *